United States Patent

Mandyam et al.

[11] Patent Number: 6,081,155
[45] Date of Patent: Jun. 27, 2000

[54] DIGITAL QUADRATURE DISCRIMINATOR FOR DEMODULATION OF FREQUENCY-MODULATED INFORMATION

[75] Inventors: Giridhar D. Mandyam, Dallas, Tex.; Eric Baissus, Plascassier, France

[73] Assignee: Texas Instruments Incorporated, Dallas, Tex.

[21] Appl. No.: 09/205,484

[22] Filed: Dec. 4, 1998

[51] Int. Cl.[7] ................. H03K 9/06; H03D 3/02
[52] U.S. Cl. ............. 329/336; 329/341; 329/343; 375/328
[58] Field of Search ............................ 329/336, 341, 329/343; 375/328

[56] References Cited

U.S. PATENT DOCUMENTS

| | | | |
|---|---|---|---|
| 3,980,824 | 9/1976 | Lamb et al. | 375/283 |
| 4,435,682 | 3/1984 | Boudault et al. | 329/313 |
| 5,200,835 | 4/1993 | Sakamoto | 329/318 |
| 5,910,752 | 6/1999 | Filipovic et al. | 329/341 |

*Primary Examiner*—Siegfried H. Grimm
*Attorney, Agent, or Firm*—Robert N. Rountree; Frederick J. Telecky, Jr.

[57] ABSTRACT

A circuit is designed with a delay circuit (102) coupled to receive a frequency-modulated data signal (100) at a delay input terminal. The delay circuit produces the data signal (103) after a predetermined delay at a delay output terminal. An exclusive OR circuit (104) has a first input terminal coupled to the delay input terminal and has a second input terminal coupled to the delay output terminal.

18 Claims, 1 Drawing Sheet

DIGITAL QUADRATURE DISCRIMINATOR FOR DEMODULATION OF FREQUENCY-MODULATED INFORMATION

FIELD OF THE INVENTION

This invention relates to an Advanced Mobile Phone System (AMPS) and more particularly to a digital discriminator for the AMPS.

BACKGROUND OF THE INVENTION

The Advanced Mobile Phone System (AMPS) is a mature partially analog frequency-modulated (FM) mobile communications system, which is in wide use throughout the United States. Widely used AMPS handsets employ analog FM quadrature discriminator and modulator technology. These analog AMPS handsets must demodulate three primary sub-signals. These sub-signals include an analog voice signal, a supervisory audio tone (SAT) and wideband data. The downlink or received analog voice signal is compressed using simple mu-law compression yielding 1 dB gain changes for every 2 dB input change. The analog voice signal passes through a pre-emphasis filter typically having a 6 dB/octave response. The analog voice signal is restricted to a phase deviation of 12 kHz and bandlimited between 300 Hz and 3000 Hz. Thus, the analog voice signal has a peak phase deviation $\beta_{voice}$ of no more than 2.9 radians. The SAT provides a means of identifying a base station occupying a cellular channel. The SAT is always present in the AMPS signal and must be continually transponded. The SAT, therefore, must be isolated with the downlink and added to the uplink or transmitted signal. It is a fixed-frequency sinusoid of 5970 Hz, 6000 Hz or 6030 Hz. The SAT has a peak frequency deviation of 2 kHz yielding a peak phase deviation $\beta_{SAT}$ of no more than 1/3 radians. Wideband data is the only digital part of the AMPS signal. It is 10 kbps (kbits-per-second) Manchester encoded data. The two possible signal levels (+1, −1) yield a frequency deviation of 8 kHz. This wideband data is never simultaneously present with the analog voice signal. A dotting sequence of alternating ones and zeros precedes the wideband data control messages. This dotting sequence presents a strong spike at 5 kHz after FM demodulation.

An AMPS voice signal for carrier signal $f_c$ may be represented as $$A(t) = \cos(2\pi f_c t) - \sin(2\pi f_c t)\phi(t) \qquad [1]$$

The voice signal of equation [1] may be simplified where $\phi(t)$ is close to zero so that at intermediate frequency $f_{IF}$ the voice signal is represented as $$A_{IF}(t) = \cos(2\pi f_{IF} t + \phi(t)) \qquad [2]$$

where $\phi(t)$ is a complex argument. This intermediate frequency $f_{IF}$ passes through a limiter, thereby producing a signal based on its sign. This limited IF signal (almost a square wave) is represented as $$z(t) = sgn\{A_{IF}(t)\} \qquad [3]$$

and is presented to a typical analog discriminator.

These analog discriminators, however, require substantial area and have filter bandwidths and phase distortion that are difficult to control. Moreover, if digital processing is required, an antialiasing filter and analog-to-digital converter (ADC) must follow the analog discriminator. Similarly, AMPS transmit requirements such as pre-emphasis, companding and other signal processing functions such as integration and filtering are costly to implement with analog designs.

SUMMARY OF THE INVENTION

These problems are resolved by a circuit comprising a delay circuit coupled to receive a frequency-modulated data signal at a delay input terminal. The delay circuit produces the data signal after a predetermined delay at a delay output terminal. An exclusive OR circuit has a first input terminal coupled to the delay input terminal and has a second input terminal coupled to the delay output terminal.

The exclusive OR circuit of the present invention reduces area and power requirements in view of previous analog discriminator circuits.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
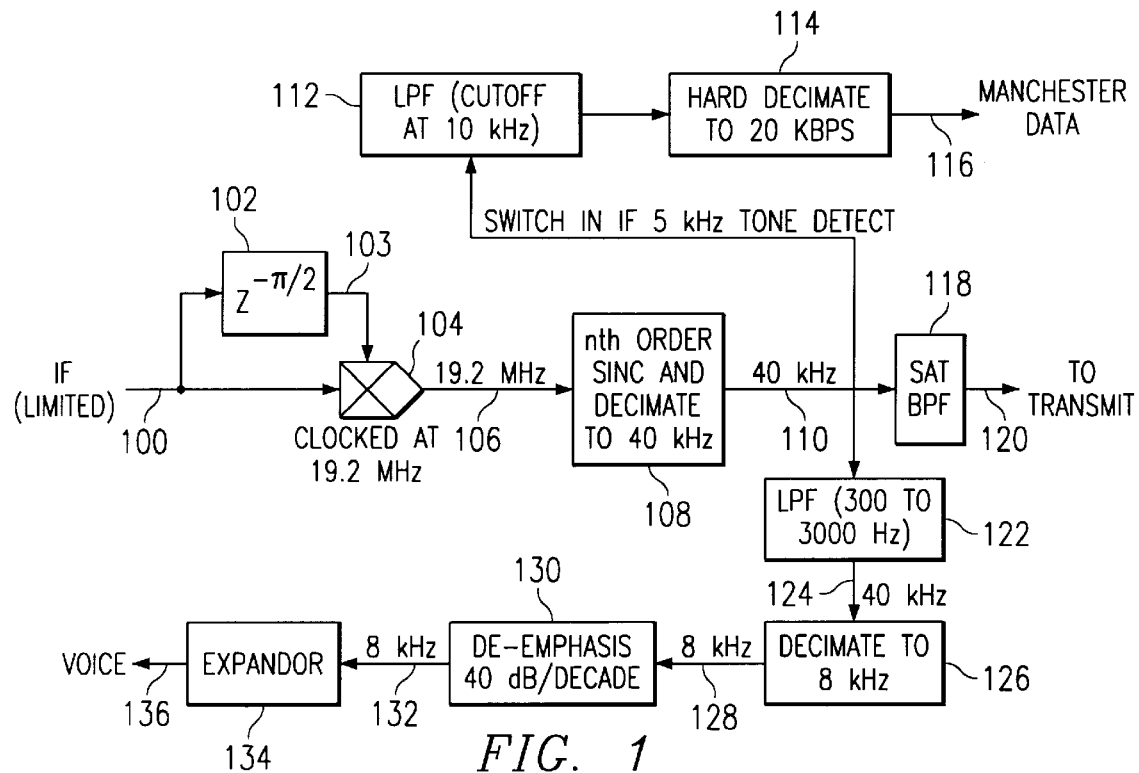
FIG. 1 is a simplified block diagram of an AMPS receiver with a digital discriminator circuit of the present invention.

Referring to FIG. 1, there is a simplified block diagram of an AMPS receiver with a digital discriminator circuit of the present invention. The digital discriminator circuit includes delay circuit 102 and exclusive OR circuit 104. The digital discriminator circuit receives the limited IF signal of equation [3] on lead 100. The first three Fourier components of this signal are $$z(t) = \frac{4}{\pi}\cos[2\pi f_{IF} t + \theta(t)] - \qquad [4]$$
$$\frac{4}{3\pi}\cos[6\pi f_{IF} t + 3\theta(t)] + \frac{4}{5\pi}\cos[10\pi f_{IF} t + 5\theta(t)]$$

representing the odd harmonics of the square wave. The delay circuit produces a 90° phase shifted signal of equation [4] on lead 103 as $$z\left(t + \frac{T_{IF}}{4}\right) = \frac{4}{\pi}\cos\left[2\pi f_{IF}\left(t + \frac{T_{IF}}{4}\right) + \theta\left(t + \frac{T_{IF}}{4}\right)\right] - \qquad [5]$$
$$\frac{4}{3\pi}\cos\left[6\pi f_{IF}\left(t + \frac{T_{IF}}{4}\right) + 3\theta\left(t + \frac{T_{IF}}{4}\right)\right] +$$
$$\frac{4}{5\pi}\cos\left[10\pi f_{IF}\left(t + \frac{T_{IF}}{4}\right) + 5\theta\left(t + \frac{T_{IF}}{4}\right)\right]$$

A quadrature product of equations [4] and [5] produces one desired IF term and eight undesired terms. Isolation of the desired term is accomplished by the exclusive OR circuit, since the IF frequency is much larger than the signal bandwidth. The exclusive OR circuit effectively samples the IF signal at its own clocking rate, thereby providing a sufficiently high sampling rate to capture the desired component as well as several harmonics. The undesired terms are scaled down due to the scalar division of each component by (2n+1). The higher harmonics, therefore, contribute to the composite signal as noise. This noise is further reduced by the lowpass $n^{th}$ order Sinc filter 108 and decimated to 40 kHz at lead 110.

The decimated signal at lead 110 then takes one of three signal paths based on the type of sub-signal. A dotting sequence indicating Manchester coded data will produce a strong 5 kHz tone when demodulated. This 5 kHz tone then couples the decimated signal at lead 110 to the lowpass filter 112. The lowpass filter output is further decimated to 20 kbps by sampling circuit 114 to produce Manchester wideband data at lead 116. Alternatively, a SAT bandpass filter passes any SAT that may be present to the transmit signal. Finally, voice data passes through the lowpass filter 122 and is further decimated to 8 kHz by sampling circuit 126. The signal then passes through de-emphasis 130 and expandor 134 circuits to produce a voiceband audio signal on lead 136.

Figure 2:
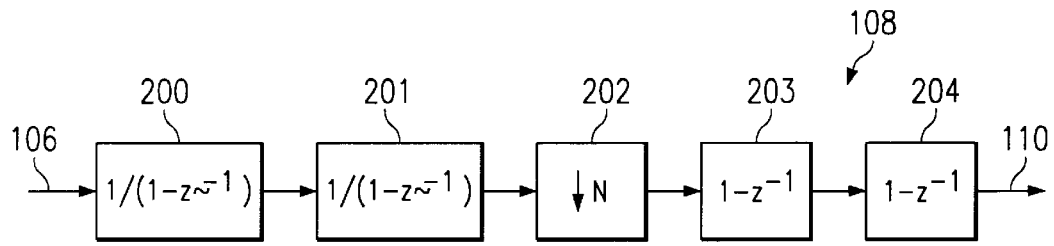
FIG. 2 is a block diagram of a second order Sinc filter that may be used with the present invention.

Turning now to FIG. 2, there is a block diagram of a second order Sinc filter that may be used with the present invention. The filter is designed to provide sufficient band-limiting for decimation as well as to adequately attenuate undesired products at frequencies greater than $2f_{IF}$. A first order Sinc filter includes integrator circuit 201, decimation circuit 202 and differentiator circuit 203. This first order circuit has a frequency response of $$H(z) = \frac{1 - z^{-N}}{1 - z^{-1}} \quad [4]$$

where N is the desired decimation factor. Where N=480, therefore, the 19.2 MHz IF signal is decimated to 40 kHz. The first order Sinc filter, however, does not significantly attenuate undesired components. Thus, a second order Sinc filter is formed by the addition of integrator 200 and differentiator 204 circuits.

Figure 3:
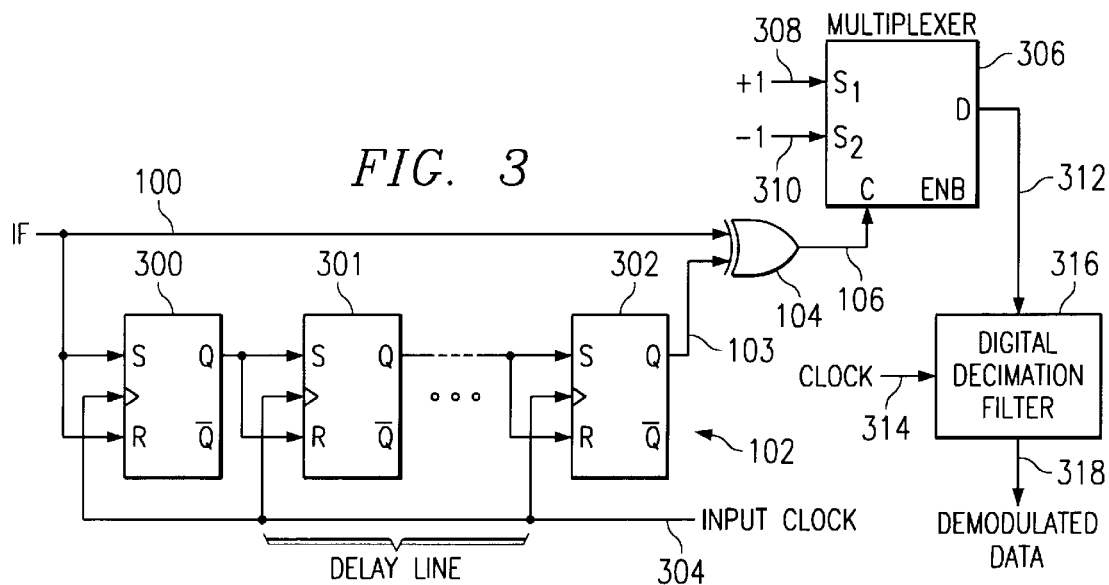
FIG. 3 is a schematic diagram of the digital discriminator circuit of FIG. 1 together with a multiplex circuit and digital decimation filter.

Although the invention has been described in detail with reference to its preferred embodiment, it is to be understood that this description is by way of example only and is not to be construed in a limiting sense. For example, the circuit of FIG. 3 shows another embodiment of the digital discriminator circuit of FIG. 1 together with a multiplex circuit and digital decimation filter. The delay circuit 102 is formed by a delay line including latch or flip-flop circuits 300–302. The flip-flop circuits are connected in series and clocked by a common clock at lead 304. The delay, therefore, is equal to a product of the period of the clock and the number of flip-flop circuits. The limited IF signal on lead 100 and the delayed IF signal on lead 103 are applied to the exclusive OR circuit 104. The exclusive OR circuit produces a select signal on lead 106 that is applied to multiplexer circuit 306. A logic level of this signal on lead 106 applies a respective +1 on lead 308 or −1 on lead 310 to output lead 312. The output signal on lead 312 is then applied to the digital decimation filter 316. A clock signal CLOCK at lead 314 controls the decimation factor of the digital decimation filter, thereby producing demodulated data on lead 318. In yet another embodiment, the multiplexer circuit 306 might be replaced by an up/down counter. The up/down counter would increment or decrement an output signal applied to the digital decimation filter in response to a logic level of the exclusive OR circuit output signal.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:

a delay circuit coupled to receive a frequency-modulated data signal at a delay input terminal, the delay circuit producing the data signal after a predetermined delay at a delay output terminal;

an exclusive OR circuit having an output terminal and having a first input terminal coupled to the delay input terminal and having a second input terminal coupled to the delay output terminal;

a low pass filter having an output terminal and having an input terminal coupled to the exclusive OR circuit output terminal; and a sampling circuit having a first input terminal coupled to the low pass filter output terminal and having a second input terminal coupled to receive a clock signal, the sampling circuit producing an output signal having a frequency determined by the clock signal.

2. A circuit as in claim 1, wherein the data signal is an intermediate frequency.

3. A circuit as in claim 2, wherein the predetermined delay is about 90 degrees.

4. A circuit as in claim 1, wherein the delay circuit comprises a plurality of latch circuits coupled in series, each latch circuit coupled to receive a clock signal.

5. A circuit as in claim 1, wherein the frequency of the output signal is equal to a frequency of a signal at the first input terminal divided by a frequency of the clock signal.

6. A discriminator circuit, comprising:

a delay circuit coupled to receive a data signal at a delay input terminal, the delay circuit producing the data signal after a predetermined delay at a delay output terminal; and a digital logic circuit having an output terminal and having a first input terminal coupled to the delay input terminal and having a second input terminal coupled to the delay output terminal, the digital logic circuit producing a select signal at the output terminal; and a multiplex circuit coupled to receive the select signal, the multiplex circuit producing a first logic signal in response to a first logic state of the select signal, the multiplex circuit producing a second logic signal in response to a second logic state of the select signal.

7. A discriminator circuit as in claim 6, wherein the data signal is an intermediate frequency.

8. A discriminator circuit as in claim 6, wherein the predetermined delay is about 90 degrees.

9. A discriminator circuit as in claim 6, wherein the delay circuit comprises a plurality of latch circuits coupled in series, each latch circuit coupled to receive a clock signal.

10. A discriminator circuit as in claim 6, wherein the digital logic circuit is an exclusive OR circuit.

11. A discriminator circuit as in claim 6, further comprising a sampling circuit having a first input terminal coupled to an output terminal of the multiplex circuit and having a second input terminal coupled to receive a clock signal, the sampling circuit producing an output signal having a frequency determined by the clock signal.

12. A discriminator circuit as in claim 11, wherein the frequency of the output signal is equal to a frequency of a signal at the first input terminal divided by a frequency of the clock signal.

13. A discriminator circuit, comprising:
a delay circuit coupled to receive a data signal at a delay input terminal, the delay circuit producing the data signal after a predetermined delay at a delay output terminal;
a digital logic circuit having an output terminal and having a first input terminal coupled to the delay input terminal and having a second input terminal coupled to the delay output terminal, the digital logic circuit producing a select signal at the output terminal; and
a counter circuit coupled to receive the select signal, the counter circuit incrementing a counter output signal in response to a first logic state of the select signal, the counter circuit decrementing the counter output signal in response to a second logic state of the select signal.

14. A discriminator circuit as in claim 13, further comprising an accumulator circuit coupled to receive the counter output signal.

15. A discriminator circuit as in claim 14, wherein the digital logic circuit comprises an exclusive OR circuit.

16. A discriminator circuit as in claim 15, wherein the predetermined delay is about 90 degrees.

17. A discriminator circuit as in claim 16, wherein the data signal is an intermediate frequency.

18. A discriminator circuit as in claim 17, wherein the delay circuit comprises a plurality of latch circuits coupled in series, each latch circuit coupled to receive a clock signal.

* * * * *